(12) United States Patent
Mizusawa et al.

(10) Patent No.: US 6,200,733 B1
(45) Date of Patent: Mar. 13, 2001

(54) PHOTOSENSITIVE COMPOSITION FOR SANDBLASTING AND PHOTOSENSITIVE FILM COMPRISING THE SAME

(75) Inventors: Ryuma Mizusawa; Syunji Nakazato; Hiroyuki Obiya, all of Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/172,074

(22) Filed: Oct. 14, 1998

(30) Foreign Application Priority Data

Oct. 14, 1997 (JP) .................................................. 9-295016

(51) Int. Cl.$^7$ ............................................................ G03F 7/032
(52) U.S. Cl. ........................... 430/284.1; 430/911; 522/87
(58) Field of Search .................................... 430/284.1, 911; 522/89

(56) References Cited

U.S. PATENT DOCUMENTS

| | | | |
|---|---|---|---|
| 3,907,574 | * 9/1975 | Yonezawa et al. | ............... 430/284.1 |
| 4,228,232 | * 10/1980 | Rousseau | ........................... 430/271.1 |
| 4,855,212 | * 8/1989 | Tate et al. | .......................... 430/281.1 |
| 4,956,265 | * 9/1990 | Klun et al. | .................... 430/284.1 X |

* cited by examiner

Primary Examiner—Cynthia Hamilton
(74) Attorney, Agent, or Firm—Sughrue, Mion, Zinn, Macpeak & Seas, PLLC

(57) ABSTRACT

A photosensitive composition for sandblasting and a photosensitive film having a photosensitive layer comprising the photosensitive composition are disclosed, the photosensitive composition comprising a photopolymerizable urethane (meth)acrylate oligomer having at least two acryloyl groups and/or methacryloyl groups, a photopolymerization initiator, and at least one cellulose derivative selected from the group consisting of hydroxypropyl cellulose, ethylhydroxyethyl cellulose, hydroxypropylmethyl cellulose phthalate, and hydroxypropylmethyl cellulose acetate phthalate. The composition exhibits excellent adhesion to a substrate, high sensitivity, and high resistance to sandblasting.

6 Claims, 1 Drawing Sheet

PHOTOSENSITIVE COMPOSITION FOR SANDBLASTING AND PHOTOSENSITIVE FILM COMPRISING THE SAME

FIELD OF THE INVENTION

This invention relates to a novel photosensitive composition for sandblasting. More particularly it relates to a photosensitive composition for sandblasting which is excellent in elasticity, softness, alkali developability, adhesion to a substrate, sensitivity, and resistance to sandblasting and to a photosensitive film having a photosensitive layer for sandblasting.

BACKGROUND OF THE INVENTION

Sandblasting is known as one of the techniques for patterning the surface of a substrate such as glass, stone, plastics, ceramics, leather, and wood. Pattern formation by sandblasting is carried out by a process using a stencil in which a rubber sheet, paper, etc. is stuck to the substrate and cut with a cutter, etc. to form a stencil pattern, and an abrasive is made to strike against the substrate to selectively abrade the substrate or a process using a photomask in which a photosensitive layer is provided on the substrate, a mask pattern is formed by photolithography, and an abrasive is made to strike against to selectively abrade the substrate. The former process involves troublesome operations with low working efficiency. On the other hand, the latter photolithographic process achieves high working efficiency and enables fine processing and is effective for production of circuit boards composed of a metallic pattern and an insulating pattern, particularly for the formation of a metallic wiring pattern or an insulating pattern made of ceramics, fluorescence substances, etc. of a plasma display panel.

Photosensitive compositions for the photosensitive layer which have been proposed to date for use in sandblasting include a screen-printable composition comprising a urethane prepolymer having an ethylenically unsaturated group at the terminal, a monofunctional ethylenically unsaturated compound, and a polymerization initiator (see JP-A-60-10242, the term "JP-A" as used herein means an "unexamined published Japanese patent application"), a composition comprising an unsaturated polyester, an unsaturated monomer, and a photopolymerization initiator (see JP-A-55-103554), and a composition comprising polyvinyl alcohol and a diazo resin (see JP-A-2-69754). However, since these photosensitive resin compositions are liquid, they are difficult to handle, and film thickness control is difficult.

A photosensitive composition for sandblasting, which is free from the above disadvantage, mainly comprising a urethane prepolymer having an ethylenically unsaturated group at the terminal and having incorporated therein a cellulose derivative and a polymerization initiator, is proposed in JP-A-6-161098. While the proposed composition has high elasticity, high softness and excellent alkali developability and is superior to the conventional ones in sensitivity and adhesion to a substrate, it is still unsatisfactory in sensitivity, adhesion to a substrate and resistance to sandblasting. It has therefore been demanded to develop a photosensitive composition for sandblasting with improved characteristics.

SUMMARY OF THE INVENTION

An object of the present invention is to provide a photosensitive composition for sandblasting which is excellent in sensitivity, adhesion to a substrate and resistance to sandblasting as well as elasticity, softness, and alkali developability.

Another object of the present invention is to provide a photosensitive film having a photosensitive layer comprising the above-described photosensitive composition.

The inventors have continued their study and reached the thought that modification of the photosensitive resin composition disclosed in JP-A-6-161098 supra might be a shortcut to accomplishment of the above objects, considering that the composition is easy to handle and superior to conventional photosensitive resin compositions for sandblasting in sensitivity, adhesion to a substrate and resistance to sandblasting. As a result of further study led by this thought, they have found that the sensitivity, adhesion to a substrate and resistance to sandblasting are greatly improved by using a specific cellulose compound as the cellulose derivative. The present invention has been completed based on this finding.

The present invention relates to a photosensitive composition for sandblasting comprising (A) a photopolymerizable urethane (meth)acrylate oligomer having at least two acryloyl groups and/or methacryloyl groups, (B) a photopolymerization initiator, and (C) at least one cellulose derivative selected from the group consisting of hydroxypropyl cellulose, ethylhydroxyethyl cellulose, hydroxypropylmethyl cellulose phthalate, and hydroxypropylmethyl cellulose acetate phthalate.

The present invention also relates to a photosensitive film for sandblasting having a photosensitive layer comprising the above-described photosensitive composition.

The photosensitive composition for sandblasting according to the present invention exhibits excellent sensitivity, adhesion to a substrate and resistance to sandblasting as well as high elasticity and softness and sufficient alkali developability. The photosensitive film according to the present invention is easy to position and suitable for fine processing.

DETAILED DESCRIPTION OF THE INVENTION

Figure 1:
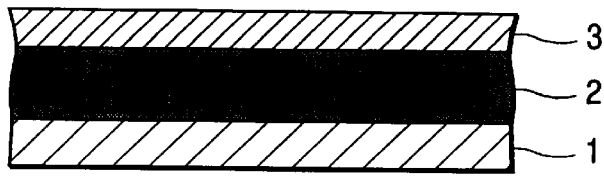
FIG. 1 is a schematic cross sectional view of a photosensitive film according to the present invention.

The photopolymerizable urethane (meth)acrylate oligomer having at least two acryloyl groups and/or methacryloyl groups as component (A) (hereinafter referred to as a urethane (meth)acrylate compound) is a reaction product between (a) an isocyanate (—NCO)-terminated compound obtained by reacting a diol compound and a diisocyanate compound and (b) a (meth)acrylate compound having a hydroxyl group. A urethane (meth)acrylate compound having not less than 4 urethane bonds in the molecule thereof is preferred as component (A). If the number of urethane bonds in the urethane (meth)acrylate compound is less than 4, the resistance to sandblasting is liable to be reduced considerably.

The diol compound used for the preparation of the urethane (meth)acrylate compound includes polyesters and polyethers having a hydroxyl group at the terminals thereof. The polyesters include those obtained by ring-opening polymerization of lactones; polycarbonates; and polyesters obtained by condensation of an alkylene glycol (e.g., ethylene glycol, propylene glycol, diethylene glycol, triethylene glycol and dipropylene glycol) and a dicarboxylic acid (e.g., maleic acid, fumaric acid, glutaric acid and adipic acid). Examples of the lactones are δ-valerolactone, ε-caprolactone, β-propiolactone, α-methyl-β-propiolactone, β-methyl-β-propiolactone, α-methyl-β-propiolactone, β-methyl-β-propiolactone, α,α-dimethyl-β-propiolactone, and β,β-dimethyl-β-propiolactone. The polycarbonates include those obtained by reacting a diol (e.g., bisphenol A, hydroquinone or dihydroxycyclohexane), and a carbonyl compound (e.g., diphenyl carbonate, phosgene or succinic anhydride). Examples of the polyethers are polyethylene glycol, polypropylene glycol, polytetramethylene glycol, and polypentamethylene glycol. Of the polyesters and polyethers, those containing a residual group of 2,2-bis (hydroxymethyl)propionic acid, 2,2-bis(2-hydroxyethyl) propionic acid or 2,2-bis(3-hydroxypropyl)propionic acid, especially 2,2-bis(hydroxymethyl)propionic acid are preferred, since they provide a urethane (meth)acrylate compound having excellent solubility in an alkali solution. The polyesters or polyethers can be used either individually or as a mixture of two or more thereof.

The diisocyanate compound to be reacted with the diol compound include aliphatic or alicyclic diisocyanate compounds, such as dimethylene diisocyanate, trimethylene diisocyanate, tetramethylene diisocyanate, pentamethylene diisocyanate, hexamethylene diisocyanate, heptamethylene diisocyanate, 2,2-dimethylpentane-1,5-diisocyanate, octamethylene diisocyanate, 2,5-dimethylhexane-1,6-diisocyanate, 2,2,4-trimethylpentane-1,5-diisocyanate, nonamethylene diisocyanate, 2,2,4-trimethylhexane diisocyanate, decamethylene diisocyanate, and isophorone diisocyanate. They can be used either individually or as a mixture of two or more thereof.

The (meth)acrylate compound having a hydroxyl group which reacts on the isocyanate group of the isocyanate-terminated compound includes hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethylene glycol monoacrylate, ethylene glycol monomethacrylate, glycerol acrylate, glycerol methacrylate, dipentaerythritol monoacrylate, and dipentaerythritol monomethacrylate. They can be used either individually or as a mixture of two or more thereof.

The urethane (meth)acrylate compound preferably has a weight-average molecular weight of 1,000 to 30,000. If the weight-molecular weight is less than 1000, a cured film of the photosensitive composition has an increased bonding force to have increased hardness, which reduces resistance to sandblasting. If the average molecular weight exceeds 30,000, the composition has an increased viscosity, which deteriorates coating properties and workability, and the resulting cured film will have an increased electrical resistance. The content of the urethane (meth)acrylate compound is generally from 50 to 90% by weight of the solids content of the photosensitive composition.

The photosensitive composition of the present invention contains at least: one cellulose derivative selected from the group consisting of hydroxypropyl cellulose, ethylhydroxyethyl cellulose, hydroxypropylmethyl cellulose phthalate, and hydroxypropylmethyl cellulose acetate phthalate as component (C) (hereinafter referred to as a cellulose compound). The cellulose compound preferably has an acid value of 50 to 250 mg/KOH, particularly 80 to 200 mg/KOH. If the acid value is less than 50 mg/KOH, the composition may tend to have insufficient developability. If the acid value is more than 250 mg/KOH, the composition may have reduced softness and reduced water resistance. The preferred acid value may be attained by using the cellulose compound in combination with an acrylic or methacrylic acid copolymer. Useful comonomers to be copolymerized with acrylic or methacrylic acid include fumaric acid, maleic acid, crotonic acid, cinnamic acid, methyl acrylate, methyl methacrylate, ethyl acrylate, ethyl methacrylate, butyl acrylate, butyl methacrylate, isobutyl acrylate, isobutyl methacrylate, monomethyl fumarate, monoethyl fumarate, monopropyl fumarate, monomethyl maleate, monoethyl maleate, monopropyl maleate, sorbic acid, hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, ethylene glycol monoacrylate, ethylene glycol monomethacrylate, glycerol acrylate, glycerol methacrylate, dipentaerythritol monoacrylate, dipentaerythritol monomethacrylate, dimethylaminoethyl acrylate, dimethylaminoethyl methacrylate, tetrahydrofurfuryl acrylate, tetrahydrofurfuryl methacrylate, acrylamide, methacrylamide, acrylonitrile, and methacrylonitrile. Preferred of them are methyl acrylate, methyl methacrylate, ethyl acrylate, ethyl methacrylate, butyl acrylate, butyl methacrylate, isobutyl acrylate, and isobutyl methacrylate. An appropriate selection of the cellulose compound gives the photosensitive composition further improvements in sensitivity, adhesion and resistance to sandblasting, enabling sandblasting in a more satisfactory manner. The photosensitive composition preferably contains the cellulose compound in an amount of 10 to 100 parts by weight per 100 parts by weight of the urethane (meth)acrylate compound.

The photopolymerization initiator as component (B) includes 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyl dimethyl ketal, benzyl-β-methoxyethyl acetal, 1-phenyl-1,2-propanedione-2-(o-ethoxycarbonyl)oxime, methyl o-benzoylbenzoate, bis(4-dimethylaminophenyl)ketone, 4,4'-bisdiethylaminobenzophenone, 4,4'-dichlorobenzophenone, benzil, benzoin, benzoin methyl ether, benzoin ethyl ether, benzoin isopropyl ether, benzoin n-butyl ether, benzoin isobutyl ether, benzoin butyl ether, p-dimethylaminoacetophenone, p-t-butyltrichloroacetophenone, p-t-butyldichloroacetophenone, thioxanthone, 2-methylthioxanthone, 2-isopropylthioxanthone, dibenzosuberone, α,α-dichloro-4-phenoxyacetophenone, and pentyl 4-dimethylaminobenzoate. These initiators can be used either individually or as a mixture of two or more thereof. The photopolymerization initiator is used in an amount of 0.1 to 20 parts by weight per 100 parts by weight of the solids content of the photosensitive composition.

If desired, the photosensitive composition can additionally comprise a photopolymerizable monomer to have further improved sensitivity and to prevent the cured film from decreasing its thickness or swelling on developing. Useful photopolymerizable monomers include monofunctional monomers, such as acrylic acid, methacrylic acid, fumaric acid, maleic acid, monomethyl fumarate, monoethyl fumarate, 2-hydroxyethyl acrylate, 2-hydroxyethyl methacrylate, ethylene glycol monomethyl ether acrylate, and ethylene glycol monomethyl ether methacrylate; and polyfunctional monomers, such as trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, and dipentaerythritol pentaacrylate. They can be used either individually or as a mixture of two or more thereof.

The photopolymerizable monomer is suitably used in an amount of not more than 20 parts by weight per 100 parts by weight of the urethane (meth)acrylate compound. If the amount exceeds 20 parts by weight, the dry film of the photosensitive composition is liable to undergo cold flow, and the ultraviolet-cured film of the photosensitive composition has reduced elasticity to have poor resistance to sandblasting.

The photosensitive composition of the present invention can be used as dissolved in a solvent. Illustrative examples of useful solvents include ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, and 4-ethoxybutyl acetate.

The photosensitive composition can arbitrarily contain dyes, polymerization inhibitors, conductive substances for electrical resistance control, such as carbon and metal particles, and cationic, anionic or amphoteric surface active agents.

The photosensitive composition for sandblasting can be applied as a liquid to a substrate or screen printed on a substrate according to the use. In the fields where fine processing is required, such as production of electronic parts, the composition is preferably used in the form of a photosensitive film which is formed by applying the composition onto a flexible film substrate followed by drying. Use of such a photosensitive film realizes abrasion machining with high precision in positioning.

An example of the photosensitive film for sandblasting is shown in FIG. 1. The photosensitive film of FIG. 1 is comprised of a flexible film, 1, a photosensitive layer 2 which comprises the photosensitive composition of the present invention, and a release film 3.

The flexible film 1, which is a substrate supporting the photosensitive layer for sandblasting, preferably has a thickness of 15 to 125 $\mu$m. The flexible film includes a film of synthetic resins, such a s poly ethylene terephthalate, polyethylene, polypropylene, polycarbonate, polyvinyl chloride, etc. A polyethylene terephthalate (PET) film is preferred for its flexibility. The photosensitive layer 2 is preferably formed by coating the flexible film 1 with a solution of the photosensitive resin composition in a solvent to a dry coating thickness of 10 to 100 $\mu$m by means of an applicator, a bar coater, a roll coater, a curtain flow coater, etc. The release film 3 is a layer for stably protecting the photosensitive layer 2 before use, which has moderate release properties so as not to come off before use but is easily strippable on use. A film of PET, polypropylene, polyethylene, etc. having a thickness of 15 to 125 $\mu$m with silicone applied or baked thereon is preferably used as a release film.

A water-soluble resin layer can be provided between the flexible film and the photosensitive layer in order to prevent the photosensitive layer from being desensitized by oxygen and to prevent a mask pattern from adhering to the photosensitive layer when it is brought into contact with the photosensitive layer for exposure. The water-soluble resin layer is preferably formed by applying a 5 to 20% by weight aqueous solution of a water-soluble polymer, such as polyvinyl alcohol or partially saponified polyvinyl acetate, to the flexible film to a dry coating thickness of 1 to 10 $\mu$m, followed by drying. It is preferred for the water-soluble polymer aqueous solution to contain ethylene glycol, propylene glycol, polyethylene glycol, etc. to have improved flexibility and improved release properties. In preparing the water-soluble polymer aqueous solution, the viscosity, antifoaming properties and the like can be improved by addition of methanol, ethylene glycol monomethyl ether, acetone, or an aqueous defoaming agent.

Figure 2A:
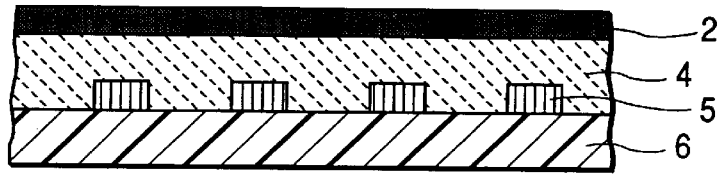
FIGS. 2(a) to (e) illustrate the steps of an etching method for obtaining a plasma display panel using the photosensitive film according to the present invention.
Figure 2B:
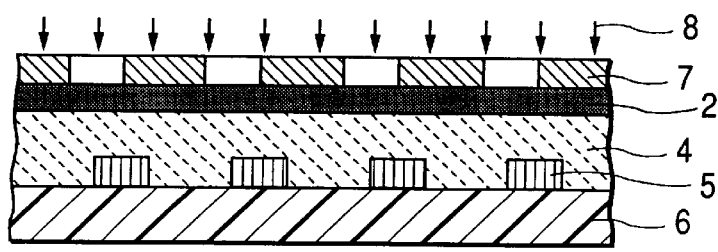
Figure 2C:
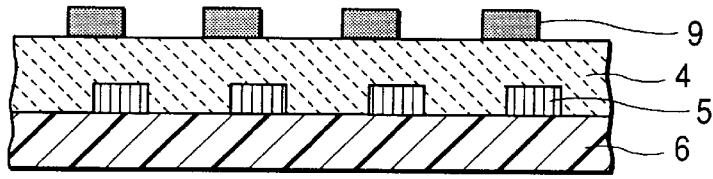
Figure 2D:
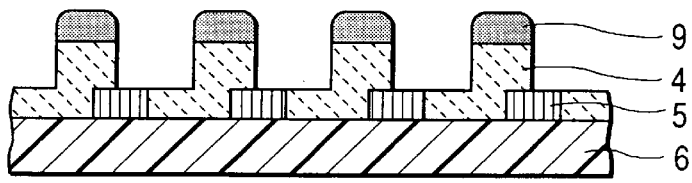
Figure 2E:
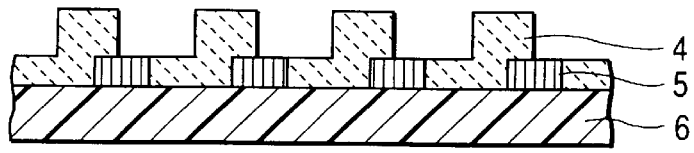

A typical manner of use of the photosensitive film according to the present invention is illustrated in FIGS. 2(a) to (e), in which a plasma display panel is prepared. As shown in FIG. 2(a), the release film 3 is stripped from the photosensitive film, and the exposed photosensitive layer 2 is brought into intimate contact with a substrate comprising an insulating layer 4, a conductor pattern 5, and a support 6 preferably by hot pressing. Hot pressing is carried out by preheating the substrate, putting the dry film thereon, and pressing. The flexible film 1 is then removed. As shown in FIG. 2(b), a mask 7 having a prescribed mask pattern is brought into contact with the exposed photosensitive layer 2, and the film is exposed to ultraviolet light through the mask by means of a low-pressure mercury lamp, a high-pressure mercury lamp, an extremely high-pressure mercury lamp, an arc lamp, a xenon lamp, etc. Excimer laser light, X-rays and electron beams are useful as well as ultraviolet light. After exposure, the mask pattern 7 is removed, and development is carried out. For carrying out development, a general-purpose alkali developer can be used. The alkalis which can be used in the alkali developer include hydroxides, carbonates, hydrogencarbonates, phosphates or pyrophosphates of alkali metals such as lithium, sodium and potassium; primary amines, such as benzylamine and butylamine; secondary amines, such as dimethylamine, dibenzylamine, and diethanolamine; tertiary amines, trimethylamine, triethylamine, and triethanolamine, cyclic amines, such as morpholine, piperazine, and pyridine; polyamines, such as ethylenediamine and hexamethylenediamine; ammonium hydroxide compounds, such as tetramethylammonium hydroxide, tetraethylammonium hydroxide, trimethylbenzylammonium hydroxide, and trimethylphenylbenzylammonium hydroxide; sulfonium hydroxide compounds, such as trimethylsulfonium hydroxide, diethylmethylsulfonium hydroxide, and dimethylbenzylsulfonium hydroxide; choline; and silicate-containing buffers. By the development, the unexposed area of the photosensitive layer 2 is removed to leave only the exposed area of the photosensitive layer 2 (cured resin layer 9) as shown in FIG. 2(c). After the development, the insulating layer 4 is etched by sandblasting to form a pattern faithful to the pattern of the cured resin layer 9 as shown in FIG. 2(d). Abrasive grains which can be used for sandblasting include glass beads or inorganic particles (e.g., SiC, $SiO_2$, $Al_2O_3$ or ZrO) having a particle size of 2 to 500 μm. The residual cured resin layer 9 is removed from the substrate by dissolving with an aqueous alkali solution (inorganic or organic alkali solutions used conventionally) to provide an etched pattern on the surface of the substrate as shown in FIG. 2(e).

The present invention will now be illustrated in greater detail with reference to Examples, but it should be understood that the present invention is not construed as being limited thereto. Unless otherwise noted, all the percents and parts are given by weight.

EXAMPLE 1

Twenty parts of carboxyl-containing urethane acrylate which has an acrylic group at the terminals (UV-9532EA, produced by The Nippon Synthetic Chemical Industry Co., Ltd.; weight average molecular weight (Mw): 24,000; acid value: 27; containing 30% of ethyl acetate as a solvent), 30 parts of carboxyl-containing urethane acrylate (SR-6138AE, produced by Daicel Chemical Industries, Ltd.; Mw: 10,000; containing 20% of ethyl acetate as a solvent), and 60 parts of a 25% methyl ethyl ketone solution of hydroxypropylmethyl cellulose acetate phthalate (HPMCAP, produced by Shin-Etsu Chemical Co., Ltd.) were mixed. The mixture was further mixed with 1 part of 2,2-dimethoxy-2-phenylacetophenone, 0.005 part of N-nitrosophenylhydroxylamine aluminum salt, 0.1 part of Malachite Green (produced by Hodogaya Chemical Co., Ltd.), and 20 parts of methyl ethyl ketone and stirred by to prepare a photosensitive composition for sandblasting.

The resulting photosensitive composition was applied to a 20 μm thick PET film with an applicator and dried to form a photosensitive layer having a dry thickness of 30 μm. A 20 μm thick polyethylene film was adhered onto the photosensitive layer under a rubber roller taking care not to entrap air bubbles to obtain a photosensitive film.

The polyethylene film was stripped from the photosensitive film, and the exposed photosensitive layer was laminated under a rubber roller on a glass substrate preheated to 80° C. The PET film was peeled off, and a test pattern mask having line widths of 50, 45, 40, 35, 30, 25, 20, 15 and 10 μm was brought into intimate contact with the exposed photosensitive layer. The photosensitive layer was exposed to ultraviolet light emitted from an ultrahigh-pressure mercury lamp at an energy of 200 mJ/cm². A 0.2% sodium carbonate aqueous solution kept at 30° C. was sprayed at a spray pressure of 1.5 kg/cm² for 30 seconds to form a pattern.

The minimum line width of the pattern thus formed was 30 μm, which is indicative of the adhesion of the pattern layer to the substrate.

The sensitivity measured with a Stouffer 21-step tablet (Stouffer Graphic Arts Equipment Co.) was 6-step.

Resistance of the pattern to sandblasting was evaluated as follows. The polyethylene film was stripped from the photosensitive film, and the exposed photosensitive layer was laminated on a glass substrate preheated to 80° C. by means of a rubber roller. The PET film was removed, and the entire surface of the exposed photosensitive layer was exposed to light at an exposure energy of 200 mJ/cm and subjected to sandblasting with glass beads #800 (S4#800, produced by Fuji Seisakusyo) spouted at a blasting pressure of 2 kg/cm² from a sandblast nozzle, which was located at a distance of 80 mm. The time required for the cured resin layer to disappear by abrasive wear was 100 seconds.

EXAMPLE 2

A photosensitive film for sandblasting was prepared in the same manner as in Example 1, except for replacing the 25% methyl ethyl ketone solution of hydroxypropylmethyl cellulose acetate phthalate with a 25% methyl ethyl ketone solution of hydroxypropylmethyl cellulose phthalate (HPMCP, produced by Shin-Etsu Chemical Co., Ltd.). The adhesion, sensitivity and resistance to sandblasting measured in the same manner as in Example 1 were 30 μm, 5.5-step, and 100 seconds, respectively.

COMPARATIVE EXAMPLE 1

A photosensitive film for sandblasting was prepared in the same manner as in Example 1, except for replacing the 25% methyl ethyl ketone solution of hydroxypropylmethyl cellulose acetate phthalate with a 25% methyl ethyl ketone solution of cellulose phthalate acetate (KC-71, produced by Wako Pure Chemical Industries, Ltd.). The adhesion, sensitivity and resistance to sandblasting measured in the same manner as in Example 1 were 45 μm, 4-step, and 70 seconds, respectively.

The photosensitive composition for sandblasting of the present invention exhibits excellent sensitivity, adhesion to a substrate and resistance to sandblasting as well as high elasticity and softness and sufficient alkali developability. Further, the photosensitive film having the photosensitive composition laminated is easy to position and suitable for fine processing of electronic parts.

While the invention has been described in detail and with reference to specific examples thereof, it will be apparent to one skilled in the art that various changes and modifications can be made therein without departing from the spirit and scope thereof.

What is claimed is:

1. A photosensitive composition for sandblasting comprising (A) a photopolymerizable urethane (meth)acrylate oligomer having at least two acryloyl groups and/or methacryloyl groups, (B) a photopolymerization initiator, and (C) one or more cellulose derivatives selected from the group consisting of hydroxypropylmethyl cellulose phthalate and hydroxypropylmethyl cellulose acetate phthalate, wherein said photopolymerizable urethane (meth)acrylate oligomer has a weight-average molecular weight of 1,000 to 30,000.

2. The photosensitive composition according to claim 1, wherein the content of the one or more cellulose derivatives is from 10 to 100 parts by weight per 100 parts by weight of the photopolymerizable urethane (meth)acrylate oligomer having at least two acryloyl groups and/or methacryloyl groups.

3. The photosensitive composition according to claim 1, wherein said one or more cellulose derivatives has an acid value of 50 to 250 mg/KOH.

4. The photosensitive composition according to claim 1, wherein said one or more cellulose derivatives is hydroxypropylmethyl cellulose acetate phthalate.

5. A photosensitive film for sandblasting comprising a flexible film having provided thereon a photosensitive layer for sandblasting and a release film in this order, in which said photosensitive layer comprises (A) a photopolymerizable urethane (meth)acrylate oligomer having at least two acryloyl groups and/or methacryloyl groups, (B) a photopolymerization initiator, and (C) one or more cellulose derivatives selected from the group consisting of hydroxypropylmethyl cellulose phthalate and hydroxypropylmethyl cellulose acetate phthalate.

6. The photosensitive film according to claim 5, wherein said one or more cellulose derivatives is hydroxypropylmethyl cellulose acetate phthalate.

* * * * *